United States Patent
Ashry Othman et al.

(10) Patent No.: US 10,103,712 B2
(45) Date of Patent: Oct. 16, 2018

(54) VOLTAGE VARIABLE ATTENUATOR, AN INTEGRATED CIRCUIT AND A METHOD OF ATTENUATION

(71) Applicant: ANALOG DEVICES GLOBAL, Hamilton (BM)

(72) Inventors: Ahmed Mohammad Ashry Othman, Cairo (EG); Mohamed Moussa Ramadan Esmael, Cairo (EG)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/380,358

(22) Filed: Dec. 15, 2016

(65) Prior Publication Data
US 2018/0175828 A1    Jun. 21, 2018

(51) Int. Cl.
| | | |
|---|---|---|
| H03H 11/24 | (2006.01) | |
| H03H 11/30 | (2006.01) | |
| H03H 21/00 | (2006.01) | |
| H03K 19/0175 | (2006.01) | |

(52) U.S. Cl.
CPC .......... *H03H 11/245* (2013.01); *H03H 11/30* (2013.01); *H03H 21/00* (2013.01); *H03K 19/017545* (2013.01)

(58) Field of Classification Search
CPC ...... H03H 11/245; H03H 11/30; H03H 21/00; H03K 19/017545
See application file for complete search history.

(56) References Cited

U.S. PATENT DOCUMENTS

| | | | |
|---|---|---|---|
| 4,875,023 A | 10/1989 | Maoz | |
| 5,929,719 A | 7/1999 | Turner | |
| 6,147,568 A | 11/2000 | Souetinov | |
| 8,614,597 B2 | 12/2013 | Zhang | |
| 8,633,754 B2 | 1/2014 | Granger-Jones et al. | |
| 9,590,591 B1 | 3/2017 | Ashry Othman | |
| 2003/0132814 A1* | 7/2003 | Nyberg | H01P 1/227 333/81 R |
| 2007/0200204 A1 | 8/2007 | Suzuki et al. | |
| 2017/0244388 A1 | 8/2017 | Ashry Othman | |

OTHER PUBLICATIONS

Dogan et al., "A DC-2.5GHz Wide Dynamic-Range Attenuator in 0.13μm CMOS Technology" Symposium on VLSI Circuits Digest of Technical Papers, 2005. 4 pages.
(Continued)

*Primary Examiner* — Jung Kim
(74) *Attorney, Agent, or Firm* — Knobbe Martens Olson & Bear LLP

(57) ABSTRACT

The present disclosure provides a voltage variable attenuator (VVA) with a controllable matching network. The output of the attenuation portion of the VVA is couple to a matching network. The matching network includes a resistive element, which may be a Field Effect Transistor (FET), whose resistance may be controlled as a function of attenuation. In particular, a control voltage used to control the resistance of the attenuation portion of the VVA is also used to control the resistive element of the matching network. In this manner, the output impedance of the VVA may be maintained at a desired level.

20 Claims, 9 Drawing Sheets

(56) References Cited

OTHER PUBLICATIONS

Franzwa et al., "A 50MHz-16GHz Low Distortion SOI Voltage Controlled Attenuator IC with IIP3>+38dBm and Control Range of > 25dB" 2012. 20 pages.

Min, Byungwook., "SiGe/CMOS Millimeter-Wave Integrated Circuits and Wafer-Scale Packaging for Phased Array Systems" A dissertation submitted in partial fulfillment of the requirements for the degree of Doctor of Philosophy (Electrical Engineering) in The University of Michigan, 2008. 154 pages.

Nyberg et al., "Novel Variable Attenuator pHEMT MMIC's for Millimetre Wave Radio Applications" European Microwave Week, 2002. 4 pages.

* cited by examiner

VOLTAGE VARIABLE ATTENUATOR, AN INTEGRATED CIRCUIT AND A METHOD OF ATTENUATION

BACKGROUND

Field

Embodiments of the invention relate to electronic circuits, and more particularly, to a voltage variable attenuator having a controllable matching network.

Description of the Related Technology

A voltage variable attenuator (VVA) can be used in radio frequency (RF) applications to provide a controlled amount of attenuation to signals. The amount of attenuation, or ratio of output signal power level to input signal power level, can be adjusted by an analog attenuation control signal, such as an attenuation control voltage.

SUMMARY

The present disclosure provides a voltage variable attenuator (VVA) with a controllable matching network. The output of the attenuation portion of the VVA is coupled to a matching network. The matching network includes a resistive element, which may be a Field Effect Transistor (FET), whose resistance may be controlled as a function of attenuation. In particular, a control voltage used to control the resistance of the attenuation portion of the VVA is also used to control the resistive element of the matching network. In this manner, the output impedance of the VVA may be maintained at a desired level.

In a first aspect, the present disclosure provides a voltage variable attenuator comprising: an attenuation network, having at least one series arm and at least one shunt arm, coupled to the at least one series arm, wherein the resistance of the at least one shunt arms may be controlled in order to vary the attenuation of the attenuator, further comprising: a matching network coupled to the attenuation network, wherein the matching network includes at least one element whose value may be controlled to change the output impedance of the voltage variable attenuator.

In a second aspect, the present disclosure provides an integrated circuit comprising the voltage variable attenuator of the first aspect.

In a third aspect, the present disclosure provides an integrated circuit comprising: an input port; a voltage variable attenuator coupled to the input port; a controllable matching network, coupled to the voltage variable attenuator; and an output port, coupled to the controllable matching network.

In a fourth aspect, the present disclosure provides an method of signal attenuation, comprising: propagating a radio frequency (RF) signal along a signal path through a voltage variable attenuator; attenuating the RF signal using the voltage variable attenuator, wherein the amount of attenuation is controlled by one or more control voltages; outputting the RF signal via a matching network, wherein the output impedance of the matching network is controlled by the one or more control voltages.

BRIEF DESCRIPTION OF THE DRAWINGS

The present disclosure will now be described by way of example only and with reference to the accompanying drawings.

DETAILED DESCRIPTION OF THE PREFERRED EMBODIMENT

Figure 1:
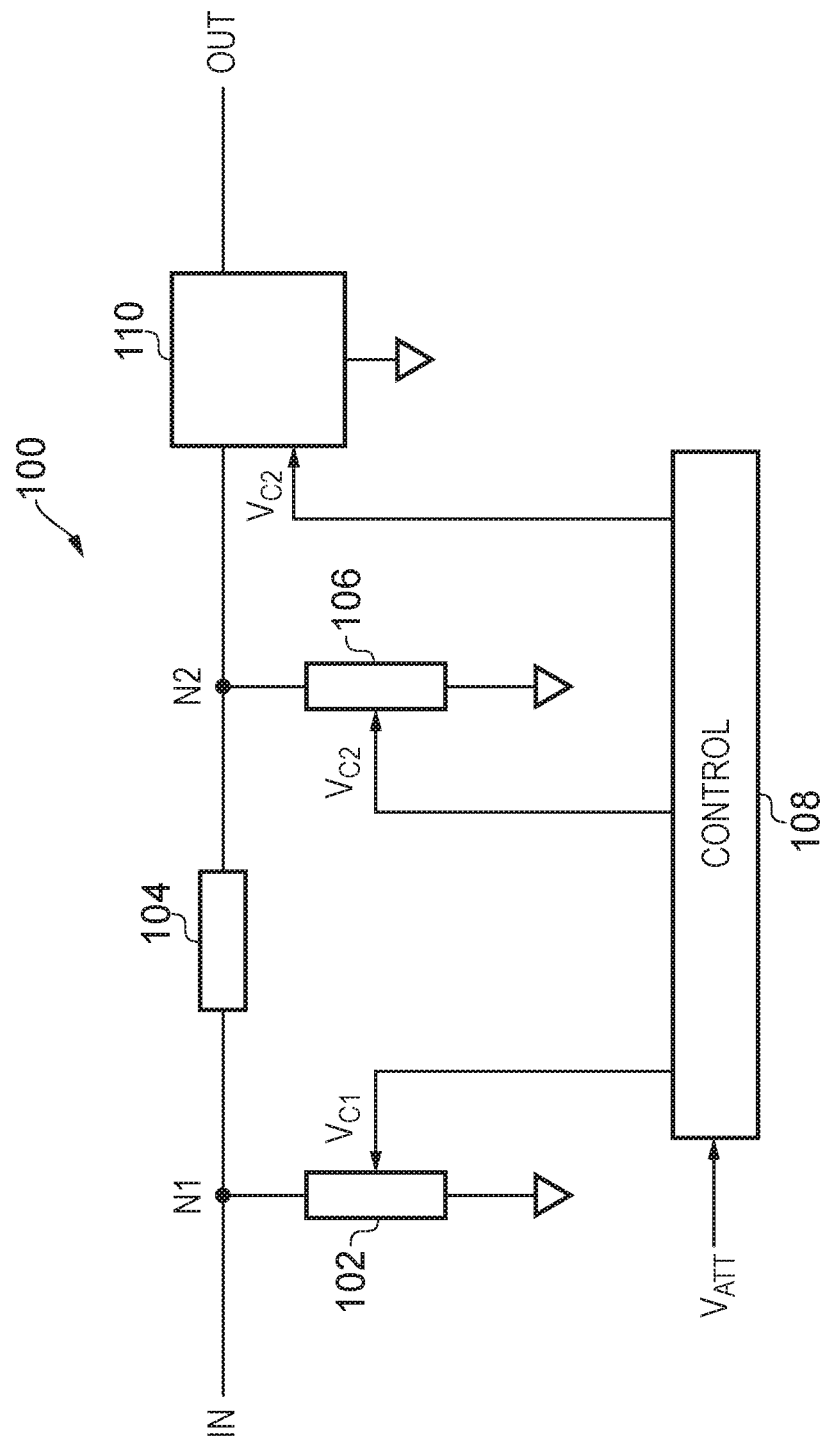
FIG. 1 is a schematic diagram showing a voltage variable attenuator in accordance with a first embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The present disclosure provides a Voltage Variable Attenuator (VVA) which includes a controllable matching network. When connecting different circuits in a signal path, it is important that the circuits are "matched" to ensure efficient transfer of signal power between the circuits. If the circuits are not matched, signal power may be wasted unnecessarily. In order to be matched effectively, the output impedance of the VVA should be matched to the circuit connected to the output of the VVA. Typically such an impedance is around 50 Ohms. However, other impedance values are possible.

During operation, VVAs are controlled in order to change their attenuation, typically by changing the resistance of one or more shunt arms. By changing the resistance of an arm connected to the output of the VVA, the output impedance of the VVA is changed. For a typical VVA, at a minimum attenuation setting, the resistance of the shunt arms is high, and the output impedance of the VVA may be around 50 Ohms. However, at a maximum attenuation setting, the resistance of the shunt arms is low, and the output impedance is low.

Be connecting a matching network to the output of the VVA, in which the resistive component is controllable in relation to the level of attenuation, the output impedance can be maintained at around 50 Ohms, regardless of the attenuation setting. In certain implementations, this may be achieved using a FET, where the FET is controlled by the same control voltage used to control the attenuation of the VVA.

FIG. 1 shows a Voltage Variable Attenuator (VVA) 100 in accordance with a first embodiment of the present disclosure. The VVA 100 may include a first shunt circuit 102, a first series circuit 104, a second shunt circuit 106, a control circuit 108, and a controllable matching network 110. The VVA 100 receives an input signal on an input terminal IN and provides an attenuated output signal on an output terminal OUT. The VVA 100 also receives an analog attenuation control signal $V_{ATT}$, which is used to control an amount of attenuation of the VVA 100 from the input terminal IN to the output terminal OUT.

Although the VVA 100 of FIG. 1 illustrates one embodiment of a VVA, the teachings herein are applicable to a wide variety of attenuators. For example, a VVA can include more or fewer shunt circuits and/or series circuits, and all circuitry can be arranged in other ways. For example, in certain implementations, the impedance of the series circuit 104 is controlled by the control circuit 108.

In the illustrated embodiment, the first series circuit 104 is electrically connected in series in a signal path between the input terminal IN and the output terminal OUT. As shown in FIG. 1, the signal path includes a node N1 between the input terminal IN and the first series circuit 104. Additionally, the signal path includes a node N2 between the first series circuit 104 and the controllable matching network 110. As shown in FIG. 1, the first shunt circuit 102 is connected between the node N1 and a DC voltage, which can be, for example, ground. Additionally, the second shunt circuit 106 is connected between the node N2 and the DC voltage. The controllable matching network 110 is connected between the node N2 and the output terminal OUT in the signal path. The controllable matching network 110 is also connected to the DC voltage.

The control circuit 108 receives the attenuation control signal $V_{ATT}$. The control circuit 108 generates various control voltages for the shunt circuits and for the controllable matching network 110. In the illustrated embodiment, the control circuit 108 generates a first control voltage $V_{C1}$, which is used to bias the first shunt circuit 102. Additionally, the control circuit 108 generates a second control voltage $V_{C2}$, which is used to bias the second shunt circuit 106, as well as the controllable matching network 110. Although FIG. 1 illustrates an embodiment in which the control circuit 108 generates a control voltage for each shunt circuit, other configurations are possible. For example, in another embodiment, a common control voltage may be used to bias each of the shunt circuits. Additionally, in another example, different control voltages may be used for each shunt circuit and for the controllable matching network 110.

The control circuit 108 generates the control voltages $V_{C1}$ and $V_{C2}$ based on the value of the analog attenuation control signal $V_{ATT}$. In certain configurations, when the analog attenuation control signal $V_{ATT}$ increases, each of the control voltages $V_{C1}$, $V_{C2}$ increase, and when the analog attenuation control signal $V_{ATT}$ decreases, each of the control voltages $V_{C1}$, $V_{C2}$ decrease. In other configurations, when the analog attenuation control signal $V_{ATT}$ increases, each of the control voltages $V_{C1}$, $V_{C2}$ decrease, and when the analog attenuation control signal $V_{ATT}$ decreases, each of the control voltages $V_{C1}$, $V_{C2}$ increase. In one embodiment, each of the control voltages $V_{C1}$, $V_{C2}$ changes substantially linearly with respect to the analog attenuation control signal $V_{ATT}$, such that each control voltage is either substantially proportionate to or inversely proportionate to the analog attenuation control signal $V_{ATT}$.

Accordingly, the control circuit 108 uses the control voltages $V_{C1}$, $V_{C2}$ to control an attenuation level or amount of an RF signal propagating between the input terminal IN and the output terminal OUT of the VVA 100. The amount of attenuation is based on the analog attenuation control signal $V_{ATT}$.

The controllable matching network 110 is also controlled by the control voltage $V_{C2}$. In one embodiment, the controllable matching network 110 is controllable to match the VVA 100 to a circuit connected to the output terminal OUT. In this embodiment, the controllable matching network 110 is controlled by control voltage $V_{C2}$, which is the same control voltage used to control the second shunt circuit 106. However, in alternative embodiments, a different control voltage could be used.

In certain configurations, the shunt circuits 102, 106 each include at least one Field Effect Transistor (FET), and the control voltages $V_{C1}$, $V_{C2}$ are used to bias the gates of the FETs. Additionally, the controllable matching network 110 may include at least one FET, and the control voltage $V_{C2}$ is used to bias the gate of the FET.

In the illustrated embodiment, the first series circuit 104 may be an inductor or a transmission line. Alternatively, the first series circuit 104 may include at least one FET. However, other configurations are possible.

The illustrated shunt circuits 102, 106 and series circuit 104 can include components such as strip line, passive devices, and/or active devices, which are arranged to control attenuation characteristics of the VVA 100. For example, the shunt circuits 104, 106 and series circuit 104 can be implemented to provide a desired range of attenuation values over a tuning range of the analog attenuation control signal $V_{ATT}$. The circuits can also be implemented to provide robust performance across a range of signal frequencies and/or to provide a relatively small phase variation from input to output for different attenuation control signal values.

The controllable matching network 110 may include a combination of resistive, capacitive, and inductive components, to form an RLC matching network. For example, in one embodiment, a FET may be used to provide a resistive element in which the resistance can be varied using the control voltage $V_{C2}$. In this manner, the matching network is controllable. In other configurations, other resistive elements whose resistance is controllable may be used.

Although the embodiment of FIG. 1 shows a VVA 100 having first and second shunt circuits 102, 106 and series circuit 104, other configurations are possible. For instance, other embodiments can use any number of shunt and series circuits.

Figure 2:
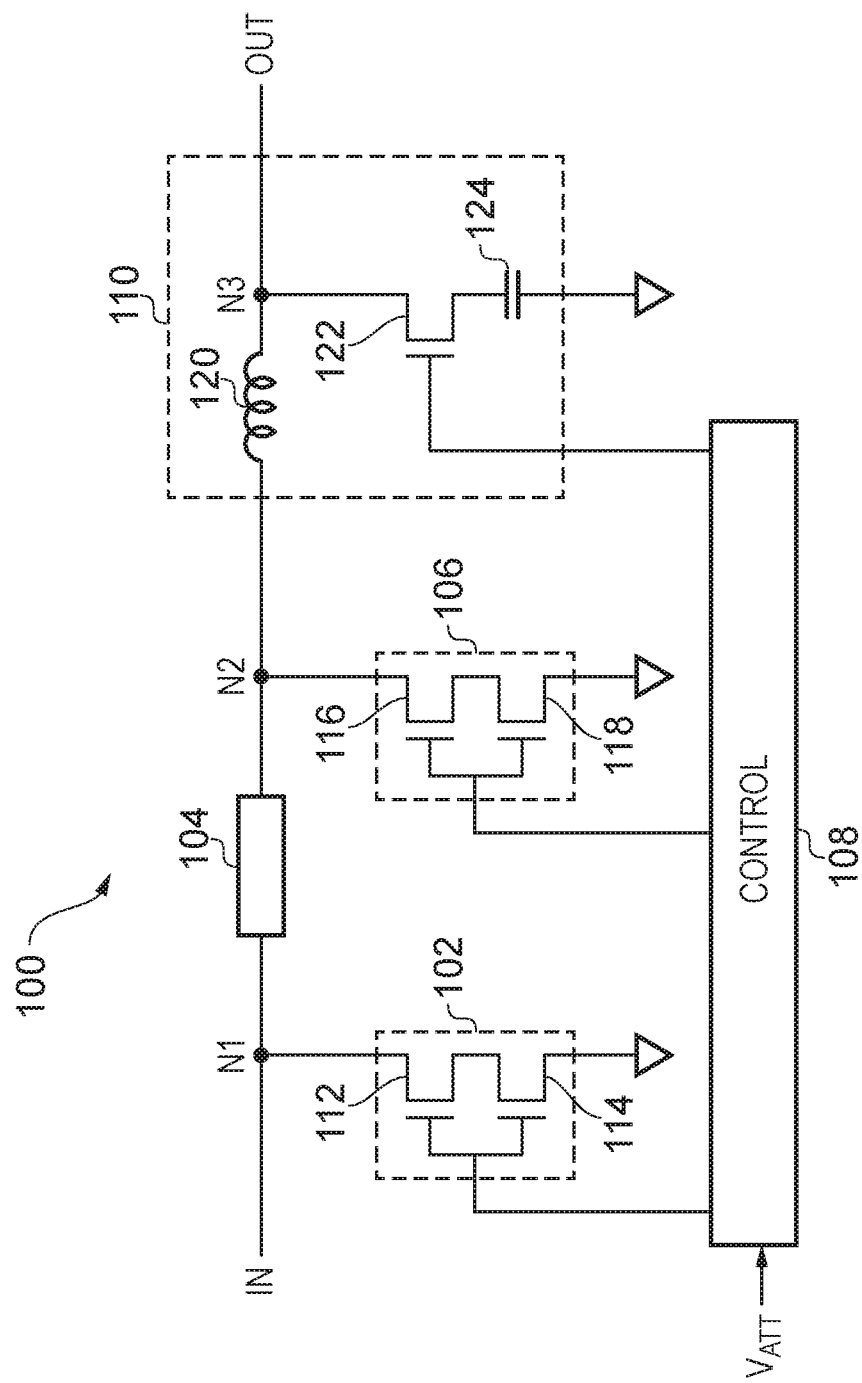
FIG. 2 is a circuit diagram showing the voltage variable attenuator of the first embodiment.

FIG. 2 shows a more detailed illustration of the VVA 100. The first shunt circuit 102 includes a first FET 112 and second FET 114. The first FET 112 and the second FET 114 are connected in series between the node N1, in the signal path, and the DC voltage. Thus, the first shunt circuit 104 operates in shunt with respect to the signal path. Although the first shunt circuit 102 is illustrated as including two FETs in series, the first shunt circuit 102 can be adapted to include more or fewer FETs. In certain configurations, the FETs are implemented as N-type FETs, such as N-type Metal-Oxide Semiconductor (NMOS) transistors. However, the teachings herein are also applicable to implementations using P-type Metal-Oxide Semiconductor (PMOS) transistors, or implementations using a combination of NMOS and PMOS transistors. Moreover, the teachings herein are applicable to other types of transistors, such as bipolar transistors, junction field-effect transistors (JFETs), and metal-semiconductor field-effect transistors (MESFETs). The control voltage $V_{C1}$ is connected to the gates of the first and second FETs 112, 114. In certain implementations, gate resistors or other isolation elements are used to provide the control voltage $V_{C1}$ to the FETs 112, 114.

The second shunt circuit 106 includes a third FET 116 and a fourth FET 118. The FETs are connected in series between the node N2 in the signal path and the DC voltage. Thus, the second shunt circuit 106 operates in shunt with respect to the signal path. Although the shunt circuit 106 is illustrated as including two FETs in series, the shunt circuit 106 can be adapted to include more or fewer FETs. In certain configurations, the FETs are implemented as N-type FETs, such as N-Type Metal-Oxide Semiconductor (NMOS) transistors. The control voltage $V_{C2}$ is connected to the gates of the third and fourth FETs 116, 118. The control voltage $V_{C2}$ biases the gates of the FETs 116, 118. In certain implementations, gate resistors or other isolation elements are used to provide the control voltage $V_{C2}$ to the FETs 116, 118.

The first to fourth FETs 112, 114, 116 and 118 of the shunt circuits provide variable impedance between the signal path and the DC voltage. The channel resistance of each FET can be controlled in an analog manner by the control voltages $V_{C1}$, $V_{C2}$. By controlling the channel resistances of FETs 112 to 118, the control voltages $V_{C1}$, $V_{C2}$ control the attenuation of the shunt circuits 102, 106.

The controllable matching network 110 may include a first inductor 120, a fifth FET 122, and a capacitor 124. The inductor 120 may be placed in the signal path between the node N2 and a node N3. The node N3 is connected between the inductor 120 and the output terminal OUT. The fifth FET 122 and the capacitor 124 are connected in series between the node N3 and the DC voltage. The control voltage $V_{C2}$ is connected to the gate of the FET 122 in order to bias the FET 122. As such, the resistance of the channel of the FET 122 is controlled by the control voltage $V_{C2}$ in the same way as third and fourth FETs 116, 118. As such, the controllable matching network 110 is an RLC network in which the resistive element is controlled by the analog voltage attenuation signal $V_{ATT}$. In certain implementations, a gate resistor or other isolation element is used to provide the control voltage $V_{C2}$ to the FET 122.

When $V_{C2}$ is low, the VVA 100 is in a minimum attenuation setting, and the output impedance is high. In this scenario, it is possible, using static matching, to provide a 50 Ohm output impedance. However, as the FETs of the second shunt circuit 106 are switched on, as the VVA 100 reaches the maximum attenuation setting, the resistance of the shunt circuit is reduced, and the output impedance is very low. This makes matching very difficult. With static matching, the output impedance will be too low.

The purpose of the controllable matching circuit 110 is ensure that the output impedance at node N3 is always around the desired output impedance (for example 50 Ohms). When $V_{C2}$ is low, and the FETs are off, providing a high resistance, the capacitor 124 is effectively disconnected, and node N3 sees the same impedance as node N2. When $V_{C2}$ is high, then the resistance of FET 122 is low. As such capacitor 124 is effectively connected, and the RLC matching circuit provides the required matching. Inductor 120 and capacitor 124 are selected to provide the required matching (for example 50 Ohms) when $V_{C2}$ is low. In other configurations, the inductor 120 could be a capacitor or a transmission line.

Typically, the VVA will require matching to 50 Ohms. In other examples, the VVA may require matching to other values of impedance, however typically the required impedance is higher than the output impedance.

As the resistance of the resistive element of the RLC circuit forming the controllable matching network 110 is also reduced, better output return loss matching is achieved. Additionally, the attenuation range of the VVA is improved. This is because matching adds another arm to the circuit, thereby improving the range of the device. Furthermore, by using a matching network that is a function of attenuation state, the insertion loss of the VVA 100 is not affected.

Figure 3:
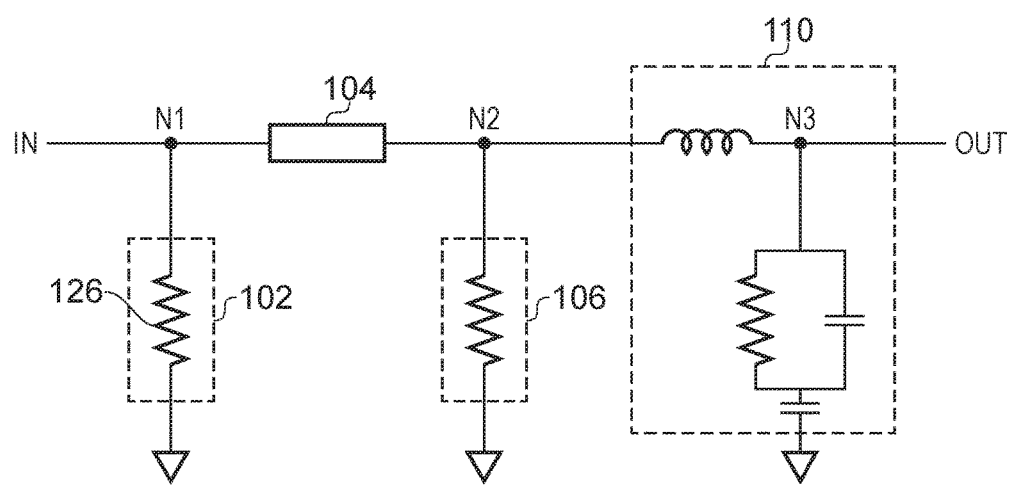
FIG. 3 is a circuit model of the voltage variable attenuator of FIG. 2.

FIG. 3 is a circuit model of the VVA 100 at the maximum attenuation state or setting. The first shunt circuit 102 is represented by a resistance 126, which may take a value of 4 to 10 Ohms, in one implementation. The second shunt circuit 106 is represented by a resistance 128, which may take a value of 4 to 10 Ohms, in one example. The fifth FET 122 is represented by a resistance 130 and a capacitance 132, formed in parallel. The resistance 130 is substantially proportional to the size of FET 122. The capacitance 132 is substantially proportional to the size of FET 122.

In other configurations, the embodiment shown in FIGS. 1 and 2 could have additional attenuation and additional matching arms. For example, to increase the range of the attenuation portion of the VVA, additional shunt arms may be included. Additional matching arms may be used for wideband operation.

Figure 4:
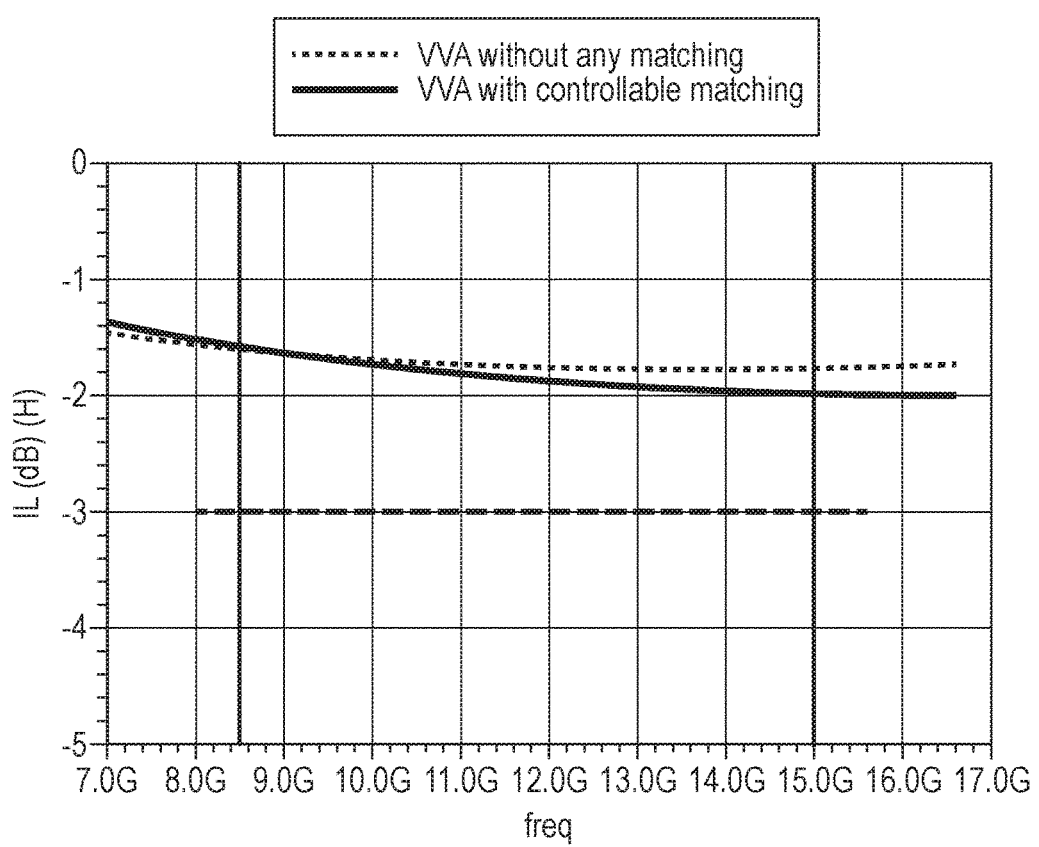
FIG. 4 is a chart showing insertion loss against frequency for a circuit including the voltage variable attenuator of FIG. 2 and for a voltage variable attenuator having no matching network.

FIG. 4 is a chart showing insertion loss against frequency. The chart compares the performance of a VVA without any matching, to the VVA shown in FIG. 2. As can be seen, there is hardly any deterioration of the insertion loss as frequency increases, when compared with a VVA with no matching. At lower frequencies, in the 7 GHz to 10 GHz range, the insertion loss is almost identical. As the frequency increases, the insertion loss of the VVA of FIG. 2 decreases slightly, compared to a VVA with no matching, such that at around 16 GHz, the insertion loss has dropped by around 0.3 dB.

Figure 5:
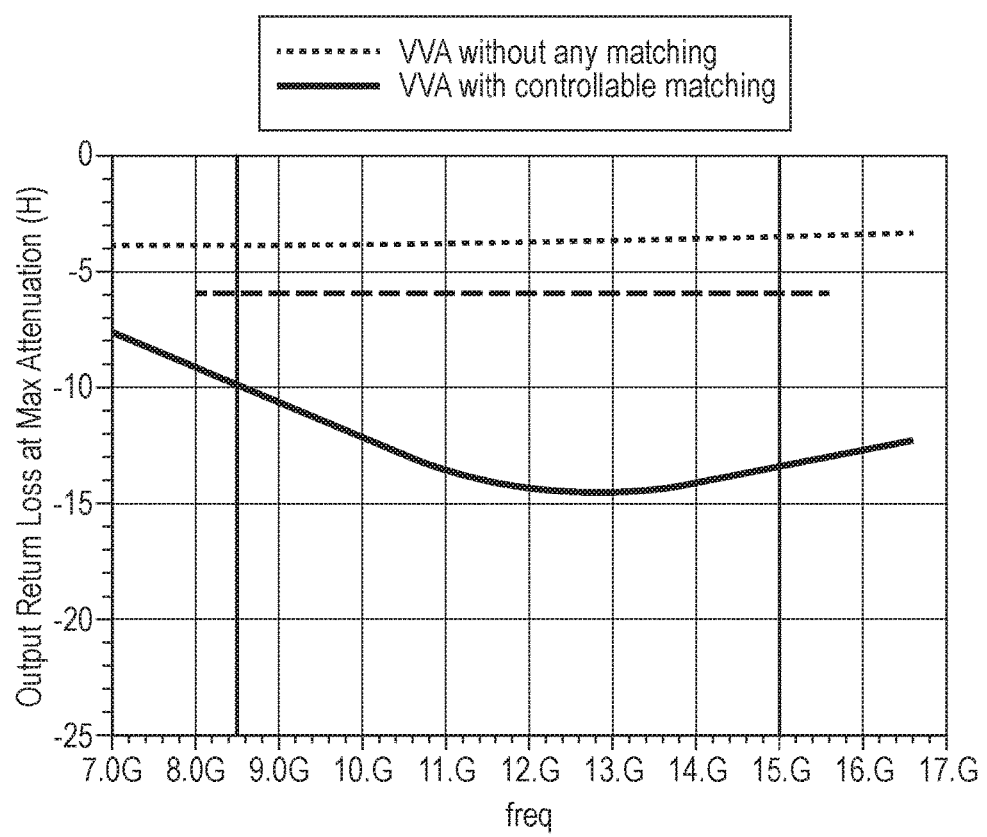
FIG. 5 is a chart showing output return loss, at maximum attenuation, against frequency for a circuit including the voltage variable attenuator of FIG. 2 and for a voltage variable attenuator having no matching network.

FIG. 5 is a chart showing the output return loss at the maximum attenuation state versus frequency. Again, the chart compares the performance of a VVA without any matching, to the VVA shown in FIG. 2. As can be seen, output return loss is significantly improved across all frequencies. At 7 GHz, the return loss is around 4 dB better than a VVA with no matching. At 12.5 GHz, the return loss is around 11 dB better than a VVA with no matching.

Figure 6:
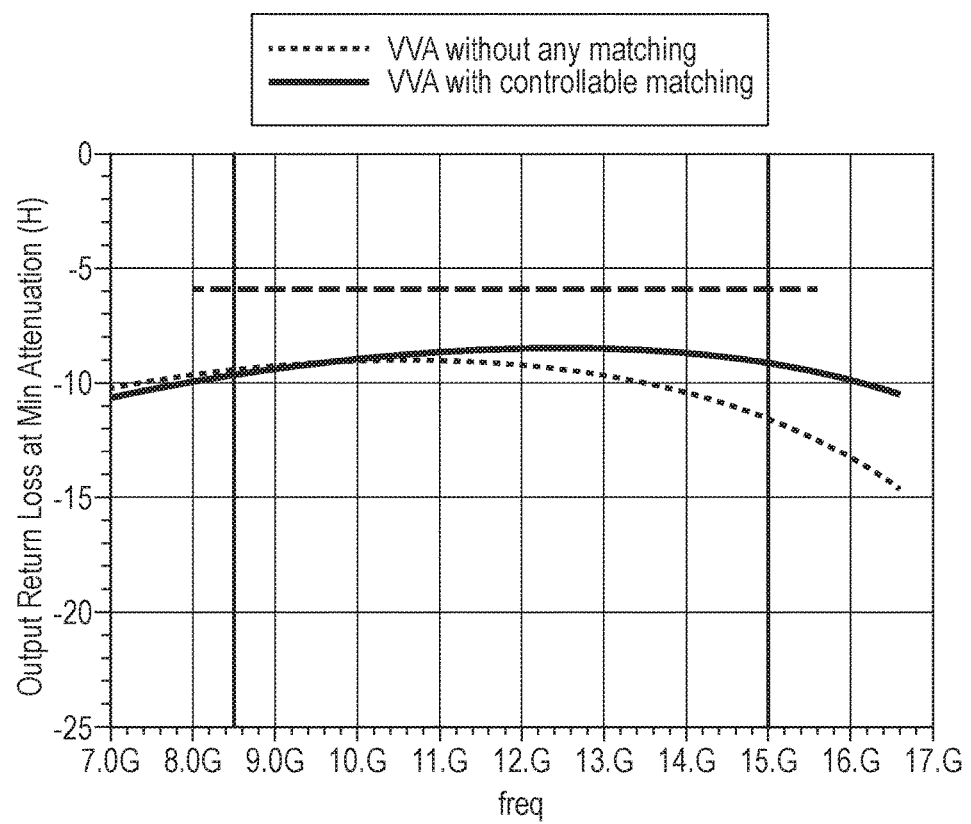
FIG. 6 is a chart showing output return loss, at minimum attenuation, against frequency for a circuit including the voltage variable attenuator of FIG. 2 and for a voltage variable attenuator having no matching network.

FIG. 6 is a chart showing output return loss at the minimum attenuation state versus frequency. As can be seen, the output return loss is only marginally worse at high frequencies. At lower frequencies, in the 7 GHz to 10 GHz range, the return loss is almost identical to a VVA with no matching. As the frequency increases, the insertion loss of the VVA of FIG. 2 increases slightly, compared to a VVA with no matching, such that at around 16 GHz, the return loss has increased by around 3 dB.

Figure 7:
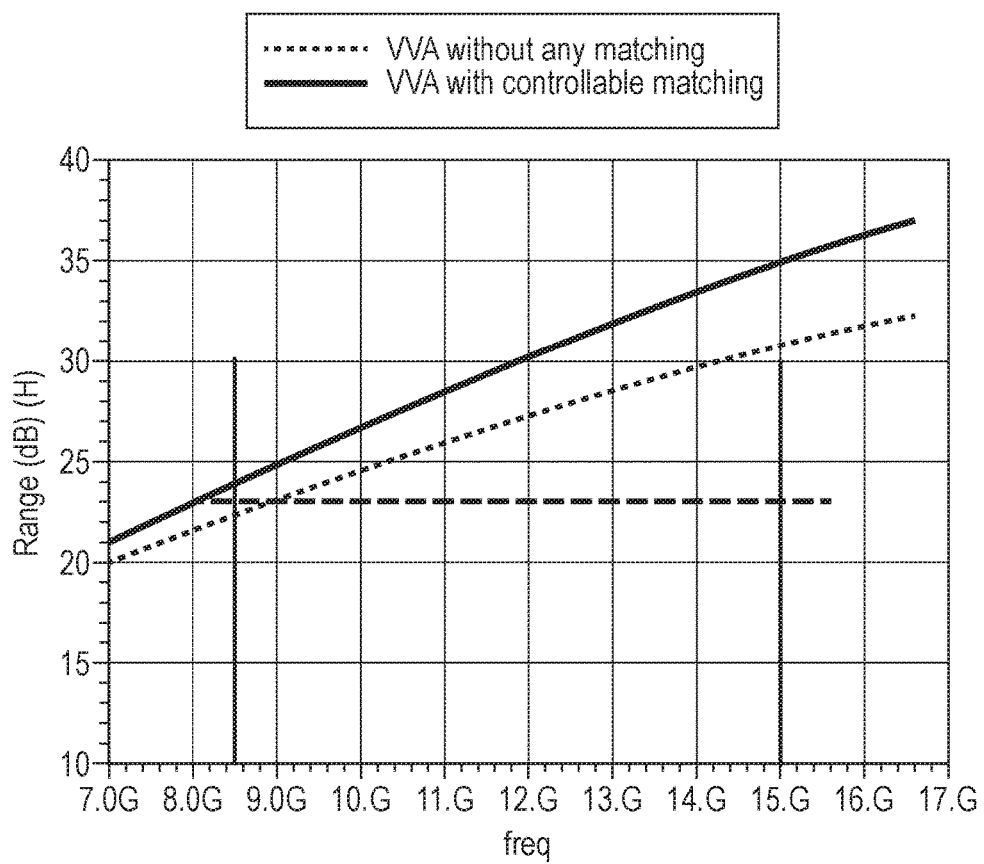
FIG. 7 is a chart showing range against frequency for a circuit including the voltage variable attenuator of FIG. 2 and for a voltage variable attenuator having no matching network.

FIG. 7 is a chart showing the range of the VVA versus frequency. As can be seen, there is an improvement to the range across all frequencies. At 7 GHz, the range is improved by around 1 dB, and at 16 GHz, the range is improved by around 5 dB.

Figure 8:
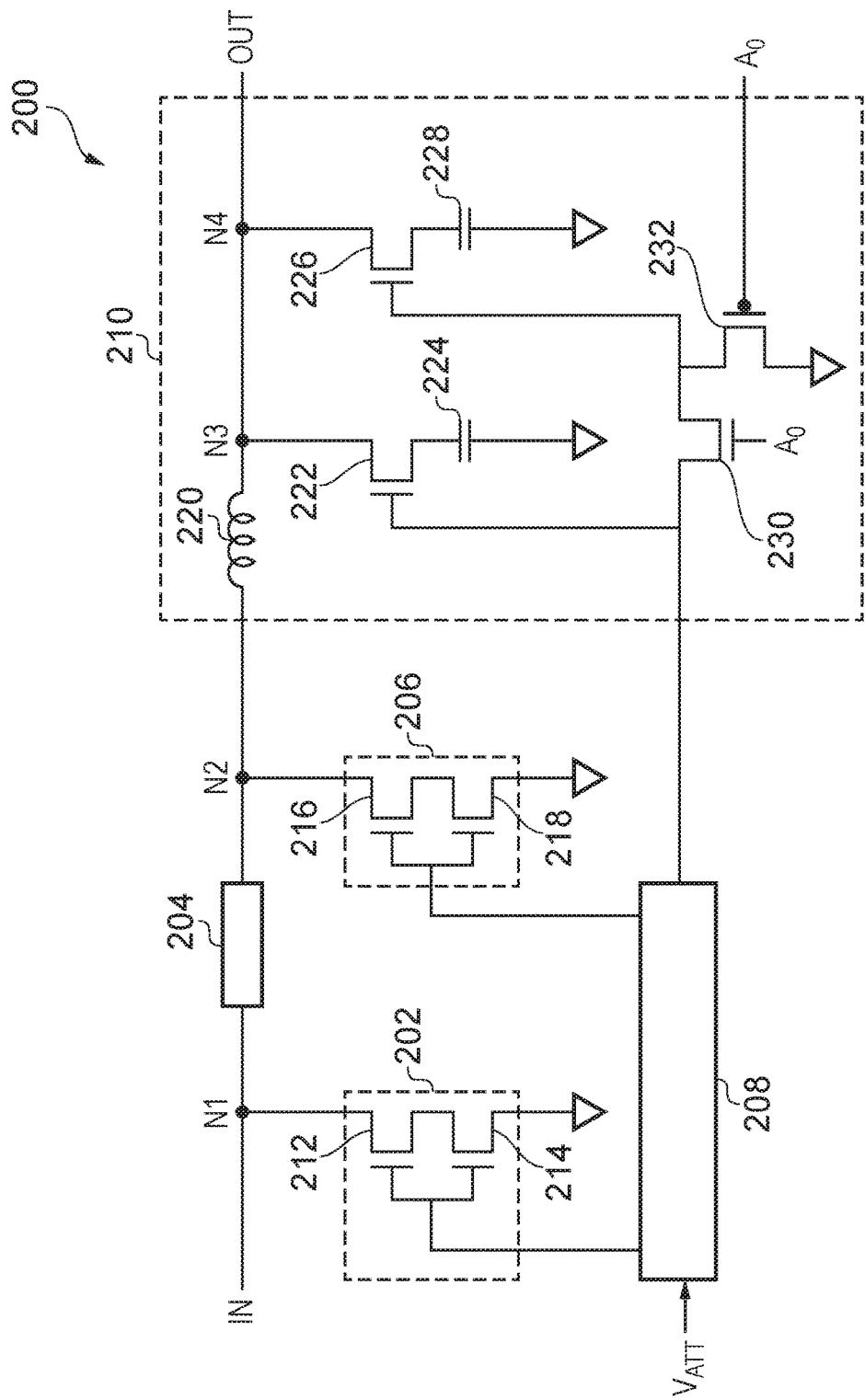
FIG. 8 is a circuit diagram showing a voltage variable attenuator in accordance with a second embodiment.

FIG. 8 shows a Voltage Variable Attenuator (VVA) 200 in accordance with a second embodiment of the present disclosure. The VVA 200 is similar to the VVA 100, however the controllable matching network is constructed in a different manner. As such, the VVA 200 may include a first shunt circuit 202, a first series circuit 204, a second shunt circuit 206, a control circuit 208, and a controllable matching network 210. The VVA 200 receives an input signal on an input terminal IN and provides an attenuated output signal on an output terminal OUT. The VVA 200 also receives an analog attenuation control signal $V_{ATT}$, which is used to control an amount of attenuation of the VVA 200 from the input terminal IN to the output terminal OUT.

As with the VVA 100, the VVA 200 is an example of one embodiment of a VVA, and the teachings herein are applicable to a wide variety of attenuators. For example, a VVA can include more or fewer shunt circuits and/or series circuits, and all circuitry can be arranged in other ways.

In the illustrated embodiment, the first series circuit 204 is electrically connected in series in a signal path between the input terminal IN and the output terminal OUT. As shown in FIG. 8, the signal path includes a node N1 between the input terminal IN and the first series circuit 204. Additionally, the signal path includes a node N2 between the first series circuit 204 and the controllable matching network 210. As shown in FIG. 8, the first shunt circuit 202 is connected between the node N1 and a DC voltage, which can be, for example, ground. Additionally, the second shunt circuit 206 is connected between the node N2 and the DC voltage. The controllable matching network 210 is connected between the node N2 and the output terminal OUT in the signal path. The controllable matching network 210 is also connected to the DC voltage.

The control circuit 208 receives the attenuation control signal $V_{ATT}$. The control circuit 208 generates various control voltages for the shunt circuits and for the controllable matching network 210. In the illustrated embodiment, the control circuit 208 generates a first control voltage $V_{C1}$ used to bias the first shunt circuit 202. Additionally, the control circuit 208 generates a second control voltage $V_{C2}$, which is used to bias the second shunt circuit 206, as well as the controllable matching network 210. Although FIG. 8 illustrates an embodiment in which the control circuit 208 generates a control voltage for each shunt circuit, other configurations are possible. For example, in another embodiment, a common control voltage may be used to bias each of the shunt circuits. Additionally, in another example, different control voltages may be used for each shunt circuit and for the controllable matching network 210.

The control circuit 208 generates the control voltages $V_{C1}$ and $V_{C2}$ based on the value of the analog attenuation control signal $V_{ATT}$. In certain configurations, when the analog attenuation control signal $V_{ATT}$ increases, each of the control voltages $V_{C1}$, $V_{C2}$ increase, and when the analog attenuation control signal $V_{ATT}$ decreases, each of the control voltages $V_{C1}$, $V_{C2}$ decrease. In other configurations, when the analog attenuation control signal $V_{ATT}$ increases, each of the control voltages $V_{C1}$, $V_{C2}$ decrease, and when the analog attenuation control signal $V_{ATT}$ decreases, each of the control voltages $V_{C1}$, $V_{C2}$ increase. In one embodiment, each of the control voltages $V_{C1}$, $V_{C2}$ changes substantially linearly with respect to the analog attenuation control signal $V_{ATT}$, such that each control voltage is either substantially proportionate to or inversely proportionate to the analog attenuation control signal $V_{ATT}$.

Accordingly, the control circuit 208 uses the control voltages $V_{C1}$, $V_{C2}$ to control an attenuation level or amount of an RF signal propagating between the input terminal IN and the output terminal OUT of the VVA 200. The amount of attenuation is based on the analog attenuation control signal $V_{ATT}$.

The controllable matching network 210 is also controlled by the control voltage $V_{C2}$. In one embodiment, the controllable matching network 210 is controllable to match the VVA 200 to a circuit connected to the output terminal OUT. In this embodiment, the controllable matching network 210 is controlled by control voltage $V_{C2}$, which is the same control voltage used to control the second shunt circuit 206. However, in alternative embodiments, a different control voltage could be used.

As with the first embodiment, in certain configurations, the shunt circuits 202, 206 each include at least one Field Effect Transistor (FET), and the control voltages $V_{C1}$, $V_{C2}$ are used to bias the gates of the FETs. Additionally, the controllable matching network 210 may include at least one FET, and the control voltage $V_{C2}$ is used to bias the gate of the FET.

In the illustrated embodiment, the first series circuit 204 may be an inductor or a transmission line. Alternatively, the first series circuit 204 may include at least one FET. However, other configurations are possible.

The illustrated shunt circuits 202, 206 and series circuit 204 can include components such as strip line, passive devices, and/or active devices, which are arranged to control attenuation characteristics of the VVA 200, in the same manner as VVA 100.

The controllable matching network 210 may include a combination of resistive, capacitive, and inductive components, to form an RLC matching network. For example, in one embodiment, a FET may be used to provide a resistive element in which the resistance can be varied using the control voltage $V_{C2}$. In this manner, the matching network is controllable.

The first shunt circuit 202 includes a first FET 212 and second FET 214. The first FET 212 and the second FET 214 are connected in series between the node N1 in the signal path, and the DC voltage. Thus, the first shunt circuit 204 operates in shunt with respect to the signal path. Although the first shunt circuit 202 is illustrated as including two FETs in series, the first shunt circuit 202 can be adapted to include more or fewer FETs. In certain configurations, the FETs are implemented as N-type FETs, such as N-type Metal-Oxide Semiconductor (NMOS) transistors. The control voltage $V_{C1}$ is connected to the gates of the first and second FETs 212, 214.

The second shunt circuit 206 includes a third FET 216 and a fourth FET 218. The FETs are connected in series between the node N2 in the signal path and the DC voltage. Thus, the second shunt circuit 206 operates in shunt with respect to the signal path. Although the shunt circuit 206 is illustrated as including two FETs in series, the shunt circuit 206 can be adapted to include more or fewer FETs. In certain configurations, the FETs are implemented as N-type FETs, such as N-Type Metal-Oxide Semiconductor (NMOS) transistors. The control voltage $V_{C2}$ is connected to the gates of the third and fourth FETs 216, 218. The control voltage $V_{C2}$ biases the gates of the FETs 216, 218.

The first to fourth FETs 212 to 218 of the shunt circuits provide variable impedance between the signal path and the DC voltage. The channel resistance of each FET can be controlled in an analog manner by the control voltages $V_{C1}$, $V_{C2}$. By controlling the channel resistances of FETs 212 to 218, the control voltages $V_{C1}$, $V_{C2}$ control the attenuation of the shunt circuits 202, 206.

The controllable matching network 210 may include a first inductor 220, a fifth FET 222, a first capacitor 224, a sixth FET 226 and a second capacitor 228. The inductor 220 may be placed in the signal path between the node N2 and a node N3. The node N3 is connected between the inductor 220 and the node N4. The node N4 is connected between the node N3 and the output terminal OUT. The fifth FET 222 and the first capacitor 224 are connected in series between the node N3 and the DC voltage. The sixth FET 226 and the second capacitor 228 are connected in series between the node N4 and the DC voltage. The control voltage $V_{C2}$ is connected to the gate of the FET 222 in order to bias the FET 222. The control voltage $V_{C2}$ is connected to the gate of the FET 226 via a seventh FET 230.

A digital control signal A0 is connected to the gate of the FET 230 in order to switch the FET 230 on and off. An eighth FET 232 is coupled in a shunt arrangement between the FET 230 and the gate of FET 226. The FET 232 is also coupled to the DC voltage. As such, the resistance of the channels of the FETs 222 and 226 are controlled by the control voltage $V_{C2}$ in the same way as third and fourth FETs 216, 318. The digital control signal A0 determines whether or not the FET 226 is controlled by $V_{C2}$. As such, the controllable matching network 210 is an RLC network in which the resistive elements are controlled by the analog voltage attenuation signal $V_{ATT}$. The manner of operation is the same as for the first embodiment.

By using a switched controllable matching network 210, the frequency range within which the network 210 provides useful matching is increased. In the illustrated embodiment, two shunt RC circuits are used in order to improve the frequency range of the device. However, in alternative configurations, three or more shunt RC circuits may be utilised. For example, capacitor 224 may be used for a first frequency, f1. Capacitors 224 and 228 may be used for a second frequency, f2. When $A_0$=1, FETs 222 and 226 are open, and matching can be provided at frequency f2. When $A_0$=0, FET 222 will be open, so matching can be provided at frequency f1.

Figure 9:
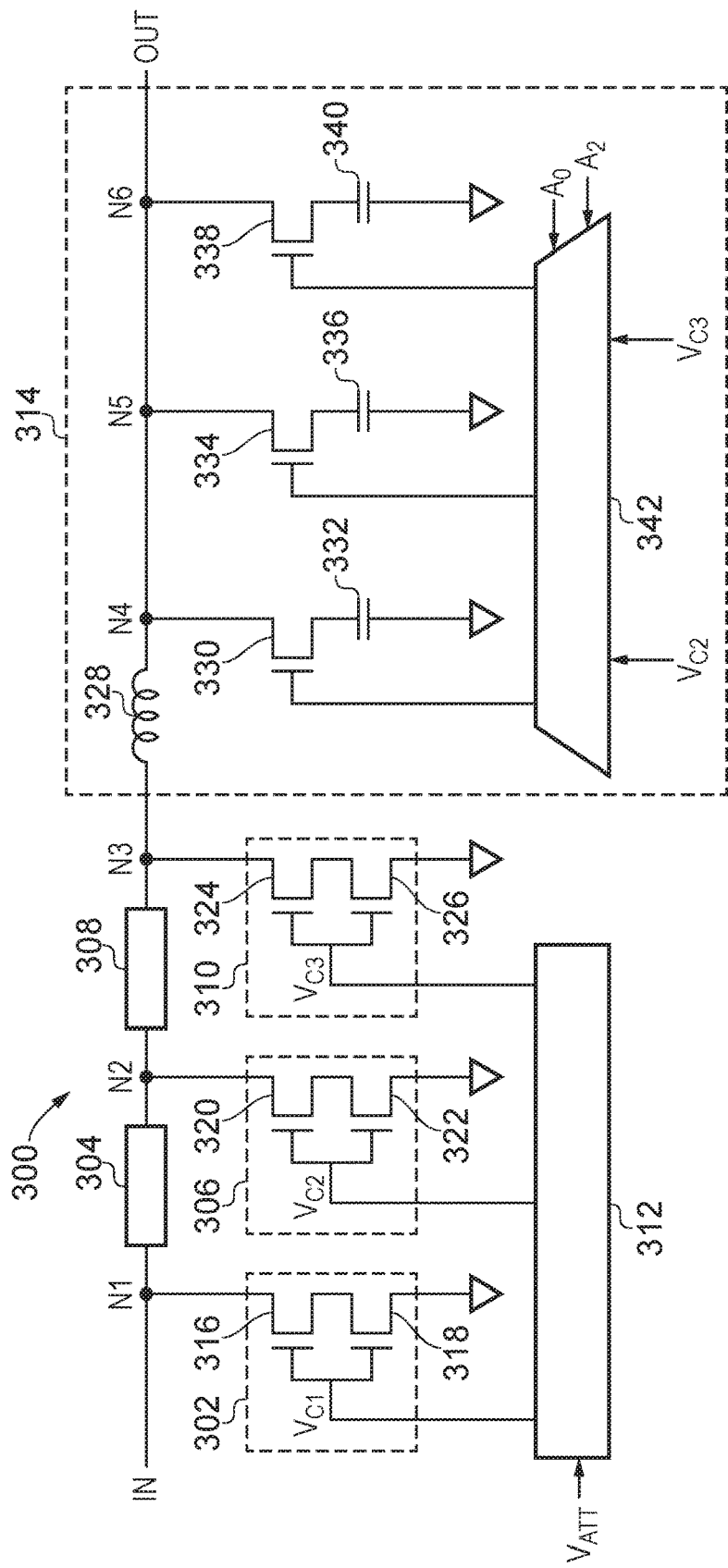
FIG. 9 is a circuit diagram showing a voltage variable attenuator in accordance with a third embodiment.

FIG. 9 shows a Voltage Variable Attenuator (VVA) 300 in accordance with a third embodiment of the present disclosure. The VVA 300 is similar to the VVA 200, however the controllable matching network is constructed in a different manner. Furthermore, the attenuating portion of the circuit includes an additional shunt circuit, in order to increase the range of the VVA.

The VVA 300 may include a first shunt circuit 302, a first series circuit 304, a second shunt circuit 306, a second series circuit 308, a third shunt circuit 310, a control circuit 312, and a controllable matching network 314. The VVA 300 receives an input signal on an input terminal IN and provides an attenuated output signal on an output terminal OUT. The VVA 300 also receives an analog attenuation control signal $V_{ATT}$, which is used to control an amount of attenuation of the VVA 300 from the input terminal IN to the output terminal OUT.

The main difference between the attenuating portion of the third embodiment, and that of the preceding embodiments, is that there are three, rather than two shunt circuits. Furthermore, there are two, rather than one series circuits. In other configurations, four or more shunt circuits and three or more series circuits could be utilised. The greater the number of shunt arms, the greater the attenuation range of the circuit. In the illustrated embodiment, other than the difference in number, the shunt and series arms are connected in the same manner as per the previous embodiment.

The control circuit 312 receives the attenuation control signal $V_{ATT}$. The control circuit 312 generates various control voltages for the shunt circuits and for the controllable matching network 314. In the illustrated embodiment, the control circuit 312 generates a first control voltage $V_{C1}$ used to bias the first shunt circuit 302. Additionally, the control circuit 312 generates a second control voltage $V_{C2}$, which is used to bias the second shunt circuit 306, and to control controllable matching network 314. Additionally, the control circuit 312 generates a third control voltage $V_{C3}$, which is used to bias the third shunt circuit 310, and to control controllable matching network 314. The control circuit 312 otherwise operates in the same manner as the control circuit 208 from the second embodiment.

The first shunt circuit 302 includes a first FET 316 and second FET 318. The first FET 316 and the second FET 318 are connected in series between the node N1 in the signal path, and the DC voltage. Thus, the first shunt circuit 302 operates in shunt with respect to the signal path. Although the first shunt circuit 302 is illustrated as including two FETs in series, the first shunt circuit 302 can be adapted to include more or fewer FETs. In certain configurations, the FETs are implemented as N-type FETs, such as N-type Metal-Oxide Semiconductor (NMOS) transistors. The control voltage $V_{C1}$ is connected to the gates of the first and second FETs 316, 318.

The second shunt circuit 306 includes a third FET 320 and a fourth FET 322. The FETs are connected in series between the node N2 in the signal path and the DC voltage. Thus, the second shunt circuit 306 operates in shunt with respect to the signal path. Although the shunt circuit 306 is illustrated as including two FETs in series, the shunt circuit 306 can be adapted to include more or fewer FETs. In certain configurations, the FETs are implemented as N-type FETs, such as N-Type Metal-Oxide Semiconductor (NMOS) transistors. The control voltage $V_{C2}$ is connected to the gates of the third and fourth FETs 320, 322. The control voltage $V_{C2}$ biases the gates of the FETs 320, 322.

The third shunt circuit 310 includes a fifth FET 324 and a sixth FET 326. The FETs are connected in series between the node N3 in the signal path and the DC voltage. Thus, the third shunt circuit 310 operates in shunt with respect to the signal path. Although the shunt circuit 310 is illustrated as including two FETs in series, the shunt circuit 310 can be adapted to include more or fewer FETs. In certain configurations, the FETs are implemented as N-type FETs, such as N-Type Metal-Oxide Semiconductor (NMOS) transistors. The control voltage $V_{C3}$ is connected to the gates of the fifth and sixth FETs 324, 326. The control voltage $V_{C3}$ biases the gates of the FETs 324, 326.

The first to sixth FETs 316 to 326 of the shunt circuits provide variable impedance between the signal path and the DC voltage. The channel resistance of each FET can be controlled in an analog manner by the control voltages $V_{C1}$, $V_{C2}$, $V_{C3}$. By controlling the channel resistances of FETs 316 to 326, the control voltages $V_{C1}$, $V_{C2}$, $V_{C3}$ control the attenuation of the shunt circuits 302, 306, 310.

The controllable matching network 210 may include a first inductor 328, a seventh FET 330, a first capacitor 332, an eighth FET 334, a second capacitor 336, a ninth FET 338 and a third capacitor 340. The inductor 328 may be placed in the signal path between the node N3 and a node N4. The node N4 is connected between the inductor 328 and the node N5. The node N5 is connected between the node N4 and the node N6. The node N6 is connected between the node N5 and the output terminal OUT. The seventh FET 330 and the first capacitor 332 are connected in series between the node N4 and the DC voltage. The eighth FET 334 and the second capacitor 336 are connected in series between the node N5 and the DC voltage. The ninth FET 338 and the second capacitor 340 are connected in series between the node N6 and the DC voltage.

The controllable matching network 314 also includes a multiplexer 342. The multiplexer 314 takes the control voltage $V_{C3}$ as its input. In other configurations, the VVA 300 may have four or more arms, and the nth arm may be controlled by a control voltage $V_{CN}$. The control voltage $V_{CN}$ is then used as the input for the multiplexer 342. The multiplexer is controlled by digital control signals $A_0$ to $A_2$. The outputs of the multiplexer are then connected to the gates of the FETs 330, 334 and 338. The digital control signals are used to determine the frequency of operation, in a similar manner to the switched configuration show in FIG. 8. The digital control determines which of the matching arms are used. As such, the controllable matching network 314 is an RLC network in which the resistive elements are controlled by the analog voltage attenuation signal $V_{ATT}$. The manner of operation is the same as for the first and second embodiments.

By using a switched controllable matching network 314, the frequency range within which the network 314 provides useful matching is increased. In the illustrated embodiment, three shunt RC circuits are used in order to improve the frequency range of the device. However, in alternative configurations, three or more shunt RC circuits may be utilised.

As noted above, the digital control signals $A_0$ to $A_2$ determine the frequency of operation. For example, capacitor 332 may be used for frequency f1, capacitors 332 and 336 may be used for frequency f2, and capacitors 332, 336 and 340 may be used at frequency f3. When $A_0=1$, FET 330 is switched on, when $A_1=1$, FETs 330 and 336 are switched on, and when $A_2=1$, FETs 330, 336 and 338 is switched on.

As noted above, the attenuation portion of the VVA 300 include a different number of shunt arms. A greater number of arms may be selected for a greater level of attenuation. The control voltage of the last shunt arm is then used to supply the multiplexer with a control signal to feed to the arms of the matching network.

In each of the above embodiments, an inductor 120, 220, 328 has been shown as part of the matching network 110, 210, 314. However, in alternative configurations, the inductor may be a transmission line or a capacitor.

In each of the aforementioned embodiments, the shunt and series circuits are configured with at least two shunt arms. The first and second embodiments include two shunt arms, and may be described as being in a Pi configuration. The present disclosure may also include configurations which include a single shunt arm. Such a configuration may be referred to as a T configuration. The total number of shunt and series arms is determined based on required range, insertion loss and linearity. The series arm may be configured to include FETs at low frequencies. At high frequencies, the series arm may include a transmission line or inductor. The VVA may include any number of arms and each arm may include any number of FETs, depending on the required operating parameters.

The primary application for the above-described VVAs is high frequency communications. In particular, VVAs are typically used to control gain. As such, the above-described VVAs may be used in any high frequency gain control application.

In the above-described configurations, the switches are implemented as FETs. However, other switches such as Bipolar Junction Transistors (BJTs) may be used.

Applications

The VVAs described herein can be used to provide controllable attenuation in a wide range of applications, including, for example, cellular, microwave, very small aperture terminal (VSAT), test equipment, and/or sensor applications. The VVAs can provide attenuation to signals of a variety of frequencies, including not only those used for cellular communications, such as 3G, 4G, WiMAX, LTE, and Advanced LTE communications, but also to higher frequencies, such as those in the X band (about 7 GHz to 12 GHz), the $K_u$ band (about 12 GHz to 18 GHz), the K band (about 18 GHz to 27 GHz), and/or the $K_a$ band (about 27 GHz to 40 GHz). Accordingly, the teachings herein are applicable to a wide variety of RF systems, including microwave communication systems.

Devices employing the above described high linearity voltage variable attenuators can be implemented into various electronic devices. Examples of the electronic devices can include, but are not limited to, consumer electronic products, parts of the consumer electronic products, electronic test equipment, etc. For example, the high linearity voltage variable attenuators described herein can be included on an integrated circuit, such as a monolithic microwave integrated circuit (MMIC), including radio frequency and/or microwave circuits, such as power amplifiers, low noise amplifiers, voltage controlled oscillators, mixers, tuners, resonators, and/or switches. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A voltage variable attenuator with controllable output matching, the voltage variable attenuator comprising:
   an attenuation network comprising at least one series arm and at least one shunt arm coupled to the at least one series arm, wherein a resistance of the at least one shunt arm is controllable in order to vary an attenuation of the voltage variable attenuator; and
   a matching network coupled to the attenuation network, wherein the matching network comprises two or more shunt matching arms that are controllable to change an output impedance of the voltage variable attenuator, and a multiplexer coupled to each of the two or more shunt matching arms and to one or more control voltages.

2. The voltage variable attenuator of claim 1, further comprising a control circuit configured to generate the one or more control voltages, wherein the one or more control voltages comprise a first control voltage arranged to control the resistance of the at least one shunt arm and that is provided to the multiplexer.

3. The voltage variable attenuator of claim 2, wherein the voltage variable attenuator is configured such that an increase in the first control voltage signal increases the attenuation of the voltage variable attenuator and decreases the output impedance of the voltage variable attenuator.

4. The voltage variable attenuator of claim 1, wherein the matching network further comprises at least one series matching arm.

5. The voltage variable attenuator of claim 4, wherein the at least one series matching arm comprises an inductive element and each of the two or more shunt matching arms comprises a capacitive element.

6. The voltage variable attenuator of claim 1, wherein the at least one series arm comprises at least one of an inductor, a transmission line, or a resistor.

7. The voltage variable attenuator of claim 1, wherein the multiplexer determines which of the two or more shunt matching arms to select based on a frequency of operation of the voltage variable attenuator.

8. The voltage variable attenuator of claim 1, implemented on an integrated circuit.

9. A voltage variable attenuator with controllable output matching, the voltage variable attenuator comprising:
an attenuation network comprising at least one series arm and at least one shunt arm coupled to the at least one series arm, wherein a resistance of the at least one shunt arm is controllable by one or more control voltages in order to vary an attenuation of the voltage variable attenuator;
a matching network coupled to the attenuation network, wherein the matching network comprises a first shunt matching arm and a second shunt matching arm that are controllable to change an output impedance of the voltage variable attenuator; and
a control circuit configured to generate the one or more control voltages for controlling the resistance of the at least one shunt arm, and to generate a separate control voltage for the matching network, the matching network further comprising a switch arranged to control which of the first shunt matching arm and the second shunt matching arm is controlled by the separate control voltage.

10. The voltage variable attenuator of claim 9, wherein the first shunt matching arm comprises a first resistive element having a controllable resistance and the second shunt matching arm comprises a second resistive element having a controllable resistance.

11. The voltage variable attenuator of claim 10, wherein the first resistive element is implemented as a first field-effect transistor (FET), and the second resistive element is implemented as a second FET.

12. The voltage variable attenuator of claim 9, wherein the at least one shunt arm of the attenuation network comprises two or more shunt arms.

13. The voltage variable attenuator of claim 9, wherein the first shunt matching arm comprises a field-effect transistor and a capacitor in series.

14. The voltage variable attenuator of claim 9, wherein the first shunt matching arm is coupled to the attenuation network by way of an inductor.

15. The voltage variable attenuator of claim 9, wherein the at least one shunt arm of the attenuation network comprises two or more shunt arms that are separately controlled by the control circuit.

16. A monolithic microwave integrated circuit (MMIC) comprising:
an input port configured to receive a radio frequency signal;
an output port configured to output an attenuated radio frequency signal; and
a voltage variable attenuator electrically coupled to the input port and to the output port, the voltage variable attenuator comprising:
an attenuation network comprising at least one series arm and at least one shunt arm coupled to the at least one series arm, wherein a resistance of the at least one shunt arm is controllable in order to vary an attenuation of the voltage variable attenuator; and
a matching network coupled to the attenuation network, wherein the matching network comprises at least two shunt matching arms that are controllable to change an output impedance of the voltage variable attenuator, and a switch arranged to control which of the at least two shunt matching arms is controlled by one or more control voltages.

17. The MMIC of claim 16, wherein the voltage variable attenuator further comprises a control circuit configured to generate the one or more control voltages, the one or more control voltages arranged to control the resistance of the at least one shunt arm.

18. The MMIC of claim 17, wherein the one or more control voltages comprise a first control voltage arranged to control the resistance of the at least one shunt arm and that is provided to the switch.

19. The MMIC of claim 18, wherein the voltage variable attenuator is configured such that an increase in the first control voltage signal increases the attenuation of the voltage variable attenuator and decreases the output impedance of the voltage variable attenuator.

20. The MMIC of claim 16, wherein the switch is controlled based on a frequency of operation of the voltage variable attenuator.

* * * * *